US010373986B2

(12) United States Patent
Lai et al.

(10) Patent No.: US 10,373,986 B2
(45) Date of Patent: Aug. 6, 2019

(54) ARRAY SUBSTRATE, DISPLAY PANEL AND DISPLAY DEVICE

(71) Applicant: XIAMEN TIANMA MICRO-ELECTRONICS CO., LTD., Xiamen (CN)

(72) Inventors: Guochang Lai, Xiamen (CN); Junyi Li, Xiamen (CN); Zhongjie Zhang, Shanghai (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 15/893,699

(22) Filed: Feb. 12, 2018

(65) Prior Publication Data

US 2018/0166467 A1 Jun. 14, 2018

(30) Foreign Application Priority Data

Aug. 25, 2017 (CN) .......................... 2017 1 0742193

(51) Int. Cl.
*H01L 27/14* (2006.01)
*H01L 27/12* (2006.01)
*G02F 1/1345* (2006.01)
*H01L 27/32* (2006.01)
*G02F 1/1333* (2006.01)

(52) U.S. Cl.
CPC ........ *H01L 27/124* (2013.01); *G02F 1/13452* (2013.01); *H01L 27/1218* (2013.01); *H01L 27/1248* (2013.01); *G02F 2001/133388* (2013.01); *G02F 2201/56* (2013.01); *H01L 27/3276* (2013.01)

(58) Field of Classification Search
CPC ............... H01L 27/124; H01L 27/1248; H01L 27/1218; H01L 27/3276; G02F 1/1362
See application file for complete search history.

(56) References Cited

U.S. PATENT DOCUMENTS

2008/0049156 A1* 2/2008 Kim .................. G02F 1/136286
349/40
2016/0093640 A1* 3/2016 Kawamura ........... H01L 27/124
257/72

(Continued)

FOREIGN PATENT DOCUMENTS

CN 104737218 B 3/2017

*Primary Examiner* — Didarul A Mazumder
*Assistant Examiner* — Wasiul Haider
(74) *Attorney, Agent, or Firm* — Kilpatrick Townsend & Stockton LLP

(57) ABSTRACT

An array substrate, a display panel and a display device, including at least two gate lines in a display area, a gate driving circuit and at least two gate fan-out lines in a non-display are described. One end of each of the gate fan-out lines are electrically connected with one signal output of the gate driving circuit and the other end of each of the gate fan-out lines are electrically connected with the gate lines. By configuring a first gate fan-out line of the gate fan-out lines and the gate driving circuit to have an overlapping area outside a mutual connection area, an area where the gate fan-out lines are overlaps the gate driving circuit, space occupied by the first gate fan-out line outside the gate driving circuit is decreased to shorten a distance between the gate driving circuit and the display area.

20 Claims, 16 Drawing Sheets

(56) References Cited

U.S. PATENT DOCUMENTS

2016/0188040 A1* 6/2016 Shin ............... G06F 3/047
            345/174
2016/0283002 A1* 9/2016 Liu ............... G06F 3/0412
2016/0364072 A1* 12/2016 Chiang ............ G06F 3/0416

* cited by examiner

ARRAY SUBSTRATE, DISPLAY PANEL AND DISPLAY DEVICE

CROSS-REFERENCE TO RELATED APPLICATIONS

This application claims the priority to Chinese Patent Application No. 201710742193.1, filed on Aug. 25, 2017, the content of which is hereby incorporated by reference in its entirety.

FIELD

The present disclosure relates to the technical field of display, in particular to an array substrate, a display panel and a display device.

BACKGROUND

In presently existing technology, screens of common display devices such as displays, televisions, mobile phones and tablet computers are usually regular rectangles. In order to improve display effects of display devices, more and more people have started to pay attention to narrow-bezel design of display devices. Among existing technologies, narrow-bezel displays are usually manufactured by reducing sizes of components at the bezel, however, not only the reduction is limited to a certain ratio, but also as a result manufacturing process becomes more difficult, a ratio of qualified products is reduced and performances of products are influenced.

Therefore, how to properly reduce a width of bezel to obtain a narrow bezel is a technical problem which needs to be solved in the field.

SUMMARY

One aspect of the present disclosure provides an array substrate, which includes a display area and a non-display area surrounding the display area. The array substrate also includes at least two gate lines in the display area, a gate driving circuit and at least two gate fan-out lines in the non-display area, respectively. One end of each of the gate fan-out lines is electrically connected with one of at least two signal outputs of the gate driving circuit and the other end of each of the gate fan-out lines is electrically connected with one of the gate lines. A first gate fan-out line of the gate fan-out lines overlaps the gate driving circuit in an overlapping area outside a mutual electrical connection area, and a portion of the first gate fan-out line in the overlapping area and the gate driving circuit are arranged in different layer.

Another aspect of the present disclosure further provides a display panel including an array substrate. The array substrate includes a display area, a non-display area surrounding the display area, at least two gate lines in the display area, a gate driving circuit and at least two gate fan-out lines in the non-display area, respectively. One end of each of the gate fan-out lines is electrically connected with one of at least two signal outputs of the gate driving circuit and the other end of each of the gate fan-out lines is electrically connected with one of the gate lines. A first gate fan-out line of the gate fan-out lines overlaps the gate driving circuit in an overlapping area outside a mutual electrical connection area, and a portion of the first gate fan-out line in the overlapping area and the gate driving circuit are arranged in different layers.

Another aspect of the present disclosure further provides a display device including a display panel. The display panel includes an array substrate. The array substrate includes a display area, a non-display area surrounding the display area, at least two gate lines in the display area, a gate driving circuit and at least two gate fan-out lines in the non-display area, respectively. One end of each of the gate fan-out lines is electrically connected with one of at least two signal outputs of the gate driving circuit and the other end of each of the gate fan-out lines is electrically connected with one of the gate lines. A first gate fan-out line of the gate fan-out lines overlaps the gate driving circuit in an overlapping area outside a mutual electrical connection area, and a portion of the first gate fan-out line in the overlapping area and the gate driving circuit are arranged in different layers.

Embodiments of the invention will be better understood from the description, the claims, and the drawings of the present disclosure.

DETAILED DESCRIPTION OF EMBODIMENTS

Figure 1A:
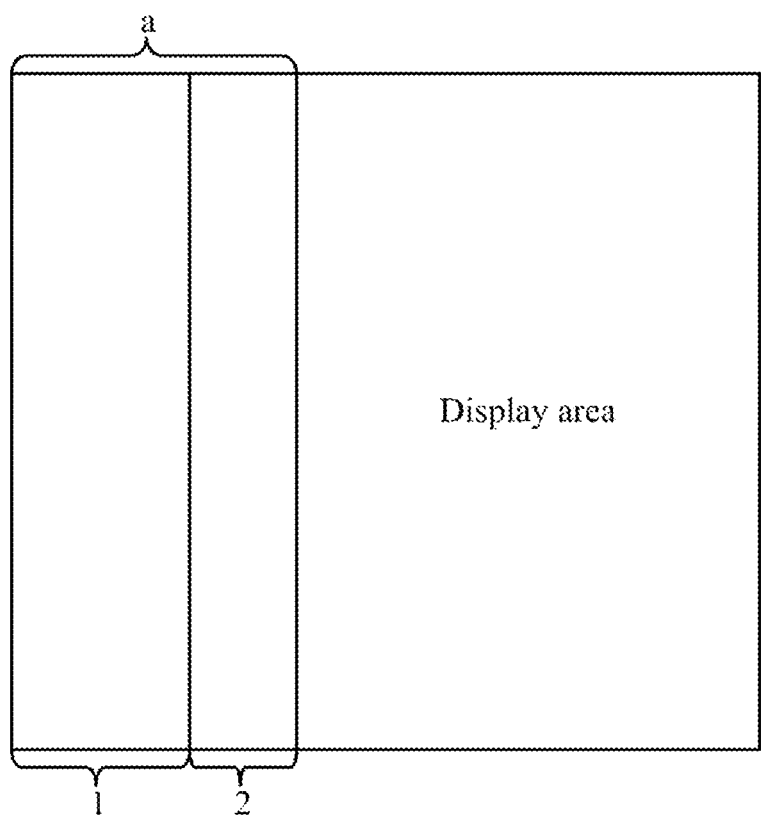
FIG. 1A illustrates a structural schematic diagram of a current array substrate.
Figure 1B:
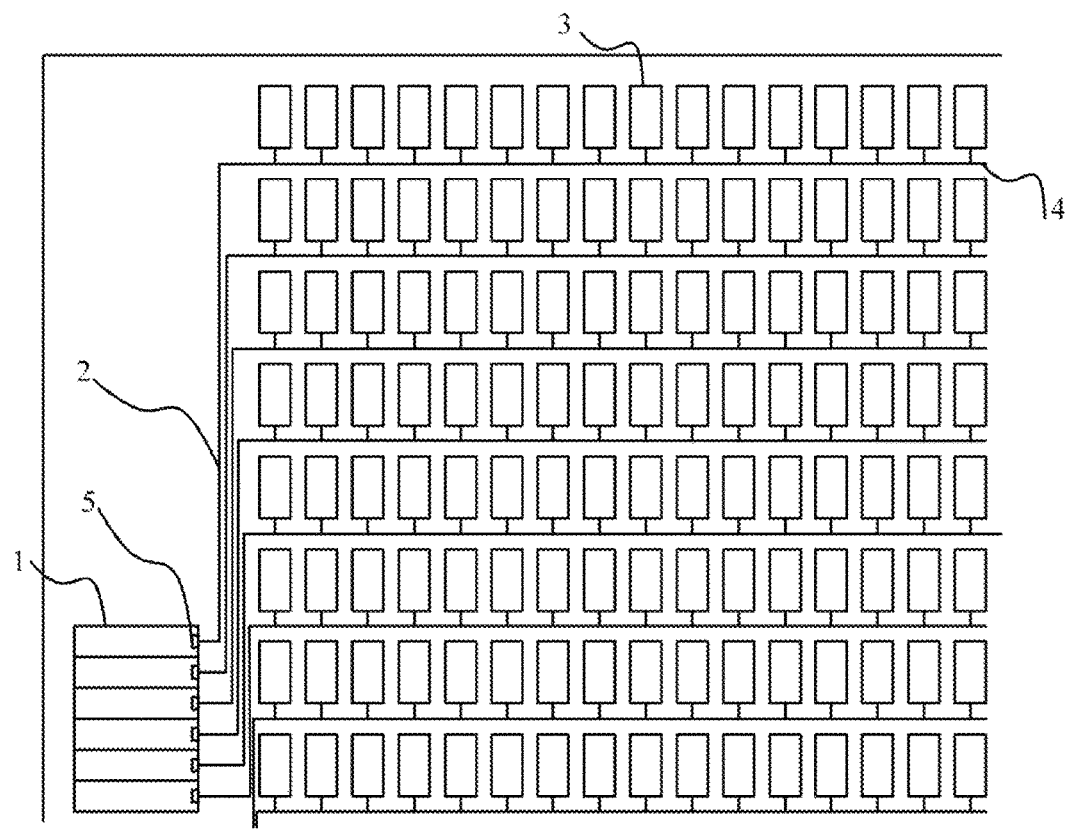
FIG. 1B illustrates a structural schematic diagram of a right-angle corner of a current array substrate.

In presently existing technology, as illustrated in FIG. 1A, a non-display area such as a left bezel of an existing array substrate generally includes components such as a gate driving circuit 1 and gate fan-out lines 2. In addition, the gate fan-out lines 2 and the gate driving circuit 1 are sequentially arranged along a direction from a display area to an outer edge at the left bezel. In one embodiment, as illustrated in FIG. 1B, which schematically illustrates a structure of a right-angle corner of the current array substrate, gate lines 4 connected with pixels 3 of the display area may need to be connected to corresponding signal outputs 5 in the gate driving circuit 1 through connected gate fan-out lines 2, where the signal outputs 5 are arranged on one side of the gate driving circuit 1 closest to the display area. Therefore, generally a total width, a, of the left bezel is a sum of widths of these components. The existence of the gate fan-out lines 2 increases space occupied by wiring between the gate driving circuit 1 and the display area, leading to an increased distance between the two and a large size of a bezel of a display device.

In addition, with the development of science and technology, people demand diverse screens of display devices. Display panels are often designed to have shapes other than regular rectangles, such as convex polygons, concave polygons, circles or rings. Such display panels are usually called special-shaped display panels. A special-shaped display panel allows diverse designs of a screen shape of a display device and can be widely applied to products such as an advertising display, an information indication screen, a vehicle display, a smart watch, a smart bracelet or VR/AR glasses.

Figure 2:
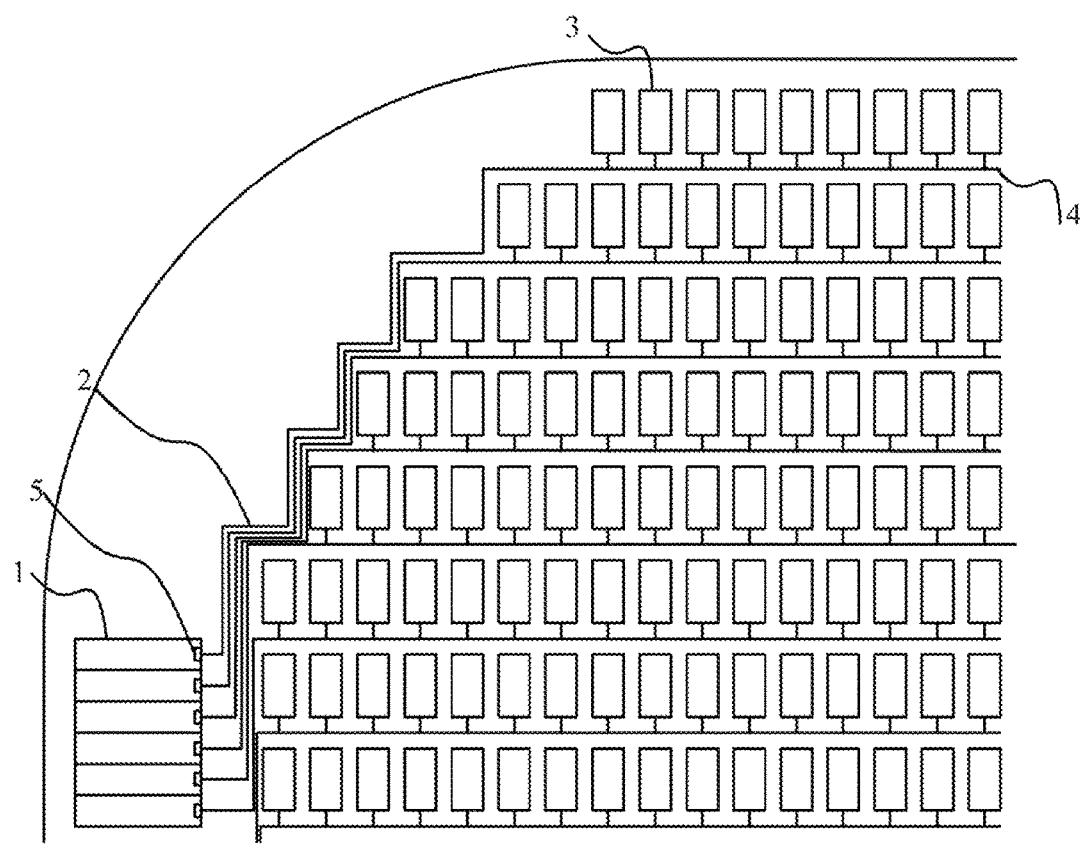
FIG. 2 illustrates a structural schematic diagram of a non-right-angle corner of a current array substrate.

FIG. 2 schematically illustrates a structure of a non-right-angle corner of a current array substrate. Generally, a gate driving circuit 1 is not arranged at the non-right-angle corner of a special-shaped display panel such as at an arc chamfer illustrated by FIG. 2, but is arranged at a position of a straight side line. Then gate lines 4 connected with pixels 3 of a display overlapping area at the arc chamfer may need to be connected to corresponding signal outputs 5 in the gate driving circuit 1 through connected gate fan-out lines 2, where the signal outputs 5 are arranged on one side of the gate driving circuit 1 closest to the display area. Such gate fan-out lines 2 increases space occupied by wiring between the gate driving circuit 1 and the display area, leading to an increased distance between the two, a large width of a non-display are and a large size of a bezel of a display device. This is contrary to the current and future development trend of narrow bezels, which affects the display device's product quality.

Therefore, regardless of a rectangular display panel or a special-shaped display panel, the problem occurs that area of gate fan-out lines enlarges a bezel.

The shapes and sizes of all components in the drawings may not reflect the actual scales and are only used for exemplarily describing the content of the present disclosure.

Figure 3A:
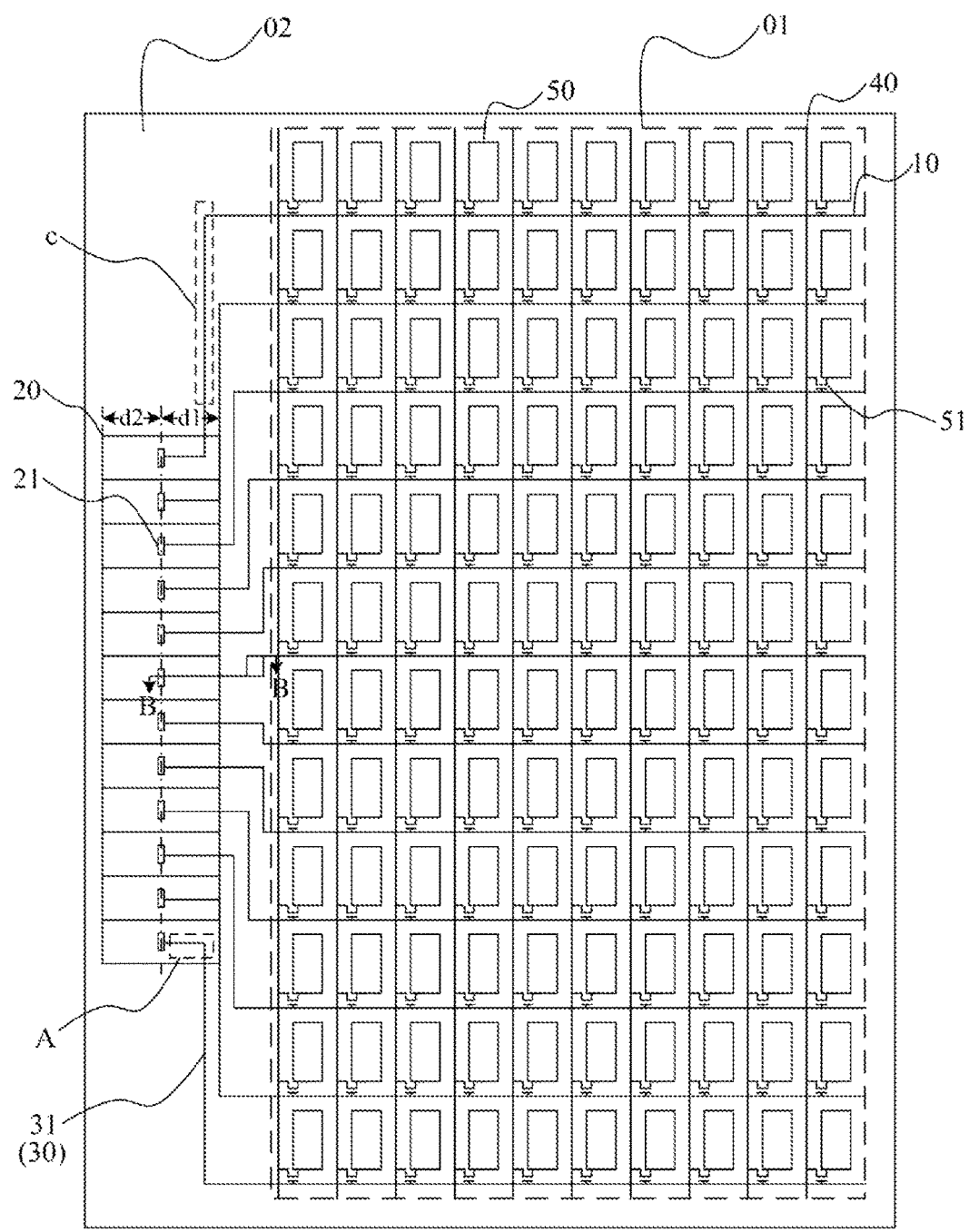
FIG. 3A illustrates a structural schematic diagram of an array substrate consistent with an embodiment of the present disclosure.

In one embodiment, as illustrated in FIG. 3A, which illustrates a structural schematic diagram of an array substrate consistent with an embodiment of the present disclosure, the array substrate includes a display area 01, a non-display area 02 surrounding the display area 01, at least two gate lines 10 in the display area 01, a gate driving circuit 20 and at least two gate fan-out lines 30 in the non-display area 02.

One end of each of the gate fan-out lines 30 is electrically connected with one of at least two signal outputs 21 of the gate driving circuit 20. The other end of each of the gate fan-out lines 30 is electrically connected with one of the gate lines 10.

A first gate fan-out line 31 of the gate fan-out lines 30 overlaps the gate driving circuit 20 in an overlapping area A outside a mutual electrical connection area, where a portion of the first gate fan-out line 31 in the overlapping area A and the gate driving circuit 20 are arranged on different layers.

In one embodiment, consistent with the embodiment of the present disclosure, the first gate fan-out line 31 of the gate fan-out lines 30 is configured to have the overlapping area A with the gate driving circuit 20 outside the mutual electrical connection area, and the portion of the first gate fan-out line 31 in the overlapping area A and the gate driving circuit 20 are arranged on different layers. In this way, the first gate fan-out line 31 overlaps the gate driving circuit 20, which means an area where the gate fan-out lines 30 are located overlaps the gate driving circuit 20, so space occupied by the first gate fan-out line 31 apart from the gate driving circuit 20 is reduced to shorten a distance between the gate driving circuit 20 and the display area 01 as much as possible, and thus a width of the non-display area 02 in an extension direction of the gate lines 10 decreases to reduce the width of a bezel of a display panel.

In one embodiment, in the array substrate consistent with the embodiment of the present disclosure, as illustrated in FIG. 3A, the gate fan-out lines 30 may all be comprised of first gate fan-out lines 31, i.e., each of all the gate fan-out lines 30 overlaps the gate driving circuit 20 in an overlapping area A apart from in a mutual electrical connection area.

In one embodiment, in the embodiment of the present disclosure, since the gate fan-out lines 30 all consist of the first gate fan-out lines 31, in a situation where layout of each shift register comprising the gate driving circuit 20 is the same, all the gate fan-out lines 30 could overlap the gate driving circuit 20 in areas A to reduce the space occupied by the gate fan-out lines 30 outside the gate driving circuit 20, to shorten the distance between the gate driving circuit 20 and the display area 01, to narrow the width of the non-display area 02 in the extension direction of the gate fan-out lines 30 and to reduce the width of the bezel of the display panel. Moreover, using shift registers having a same layout to comprise the gate driving circuit 20 could relatively simplify the complexity of layout of the gate driving circuit 20.

Figure 3B:
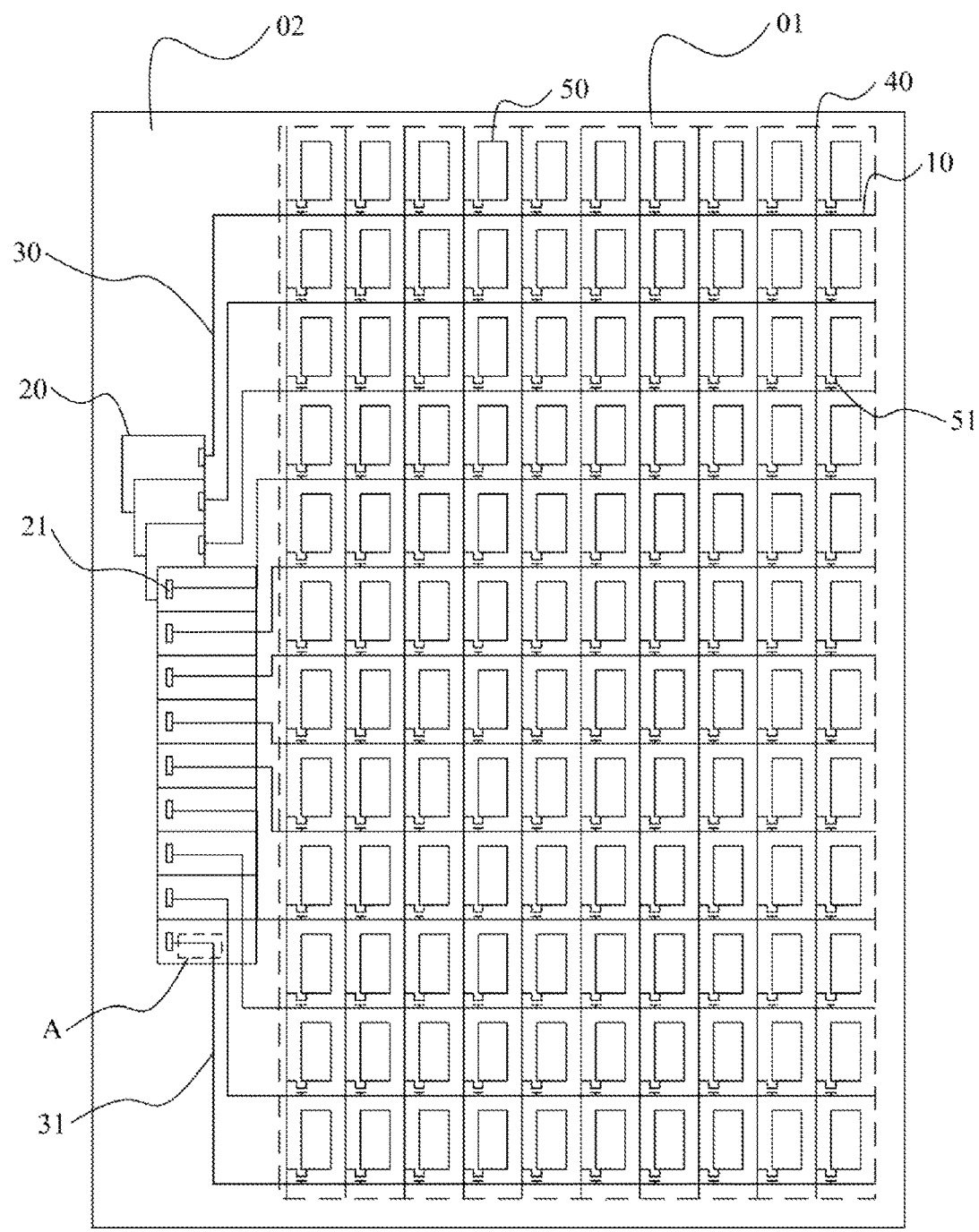
FIG. 3B illustrates a structural schematic diagram of another array substrate consistent with an embodiment of the present disclosure.

In one embodiment, as illustrated in FIG. 3B, which schematically illustrates a structure of another array substrate consistent with an embodiment of the present disclosure, the gate fan-out lines 30 may also partially consist of first gate fan-out lines 31, i.e., each of one part of the gate fan-out lines 30 overlaps the gate driving circuit 20 in an overlapping area A, apart from in a mutual electrical connection area, and each of the other part of the gate fan-out lines 30 overlaps the gate driving circuit 20 only in the mutual electrical connection area.

In one embodiment, in the embodiment of the present disclosure, at least one but not all of the gate fan-out lines 30 is a first gate fan-out line 31, which overlaps the gate driving circuit 20 in an overlapping area A so that the space occupied by the first gate fan-out line 31 outside the gate driving circuit 20 is reduced to shorten a distance between a part of the gate driving circuit 20 corresponding to the first gate fan-out line 31 and the display area 01. The remaining gate fan-out line(s) 30 only overlaps the gate driving circuit 20 in mutual electrical connection area(s). Although distance(s) between a part of the gate driving circuit 20 corresponding to the remaining gate fan-out line(s) 30 and the display area 01 is not shortened, based on a principle of fully utilizing space at the bezel to make the bezel narrow, through a proper layout, e.g. by altering spatial layout of the part of the gate driving circuit 20 corresponding to the remaining gate fan-out line(s) 30 as illustrated in FIG. 3B, making some components of this part of the gate driving circuit 20 shifted away from the other part of the gate driving circuit 20 (i.e., the part of the gate driving circuit 20 corresponding to the first gate fan-out line 31), a width of this part of the gate driving circuit 20 in the extension direction of the gate lines 10 is reduced. Or, by changing spatial layout of other circuit components (such as a short circuit ring, a test signal line or an ESD circuit) on one side of the gate driving circuit 20 farthest away from the display area 01, such as making the layout of the corresponding circuit components closer to the display area 01, the width of the non-display area 02 in the extension direction of the gate lines 10 is narrowed to reduce the width of the bezel of the display panel. It is noteworthy that, based on the rule of fully utilizing the space at the bezel, components in the gate driving circuit 20 or other circuit components in the non-display area could be properly arranged to obtain a narrow bezel in various ways which are not limited in the present disclosure.

Figure 3C:
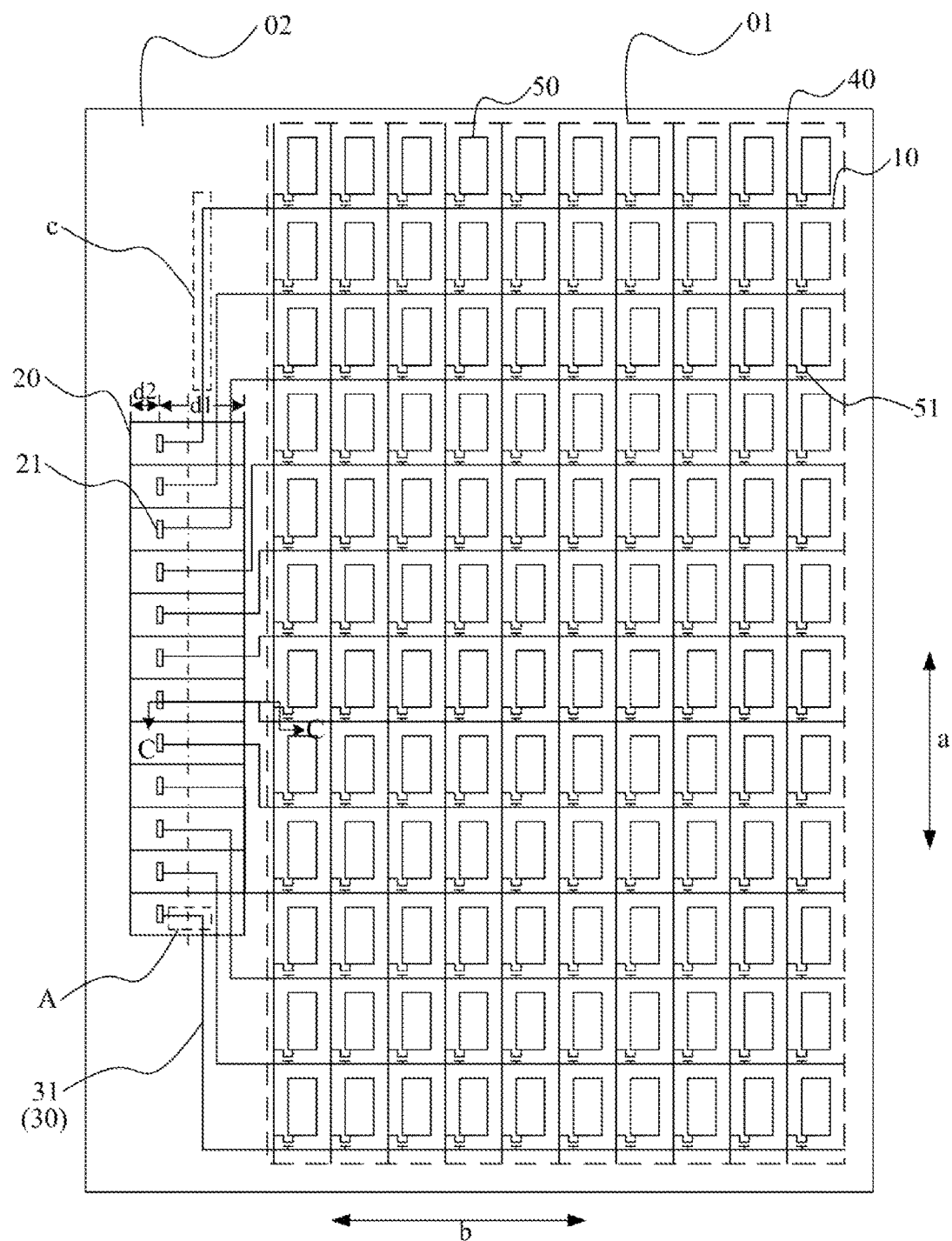
FIG. 3C illustrates a structural schematic diagram of another array substrate consistent with an embodiment of the present disclosure.

In one embodiment, in the array substrates consistent with embodiments of the present disclosure, as illustrated in FIG. 3A and in FIG. 3C, which schematically illustrates a structure of still another array substrate consistent with embodiments of the present disclosure, in the extension direction of the gate lines 10 (generally a horizontal direction), a distance between a signal output 21 electrically connected with a first gate fan-out line 31 and an edge of the gate driving circuit 20 closest to the display area 01 is a first distance d1, and a distance between the signal output 21 electrically connected with the first gate fan-out line 31 to an edge of the gate driving circuit 20 farthest away from the display area 01 is a second distance d2. The first distance d1 may be greater than or equal to the second distance d2. In one embodiment, the first distance d1 might also be smaller than the second distance d2.

In one embodiment, as illustrated in FIG. 3A, the first distance d1 may be equal to the second distance d2. Then the corresponding signal output 21 is located on a centerline of the gate driving circuit 20, and the centerline may be perpendicular to the extension direction of the gate lines 10. Or as illustrated in FIG. 3C, the first distance d1 may be greater than the second distance d2. Then the corresponding signal output 21 is located on one side of the centerline of the gate driving circuit 20 farthest away from the display area 01. In the embodiment of the present disclosure, when the first distance d1 is not smaller than the second distance d2, the overlapping area A where the first gate fan-out line 31 and the gate driving circuit 20 overlap each other can be enlarged, so that the space occupied by the first gate fan-out line 31 outside the gate driving circuit 20 is reduced to shorten the distance between the gate driving circuit 20 and the display area 01 as much as possible, and thus the width of the non-display area 02 in the extension direction of the gate lines 10 is reduced to narrow the width of the bezel of the display panel as much as possible.

It is noteworthy that, since the gate driving circuit 20 comprises of at least two components such as a transistor and a capacitor, during actual circuit layout, components on an edge of the gate driving circuit 20 are not strictly located on a straight line, as a result the actual edge of the gate driving circuit 20 is not a strictly straight line but a curved line. In order to facilitate understanding, in each of the array substrates consistent with embodiments of the present disclosure, a profile of the gate driving circuit 20 is generally drawn to be in a shape consisting of straight lines. Based on this, the distance between a signal output 21 and the edge of the gate driving circuit 20 closest to the display area 01 should be understood as the length of a shortest straight line segment from the signal output 21 to the edge of the gate driving circuit 20 closest to the display area 01. And the distance between a signal output 21 and the edge of the gate driving circuit 20 farthest away from the display area 01 should be understood as the length of a shortest straight line segment from the signal output 21 to the edge of the gate driving circuit 20 farthest away from the display area 01.

Figure 3D:
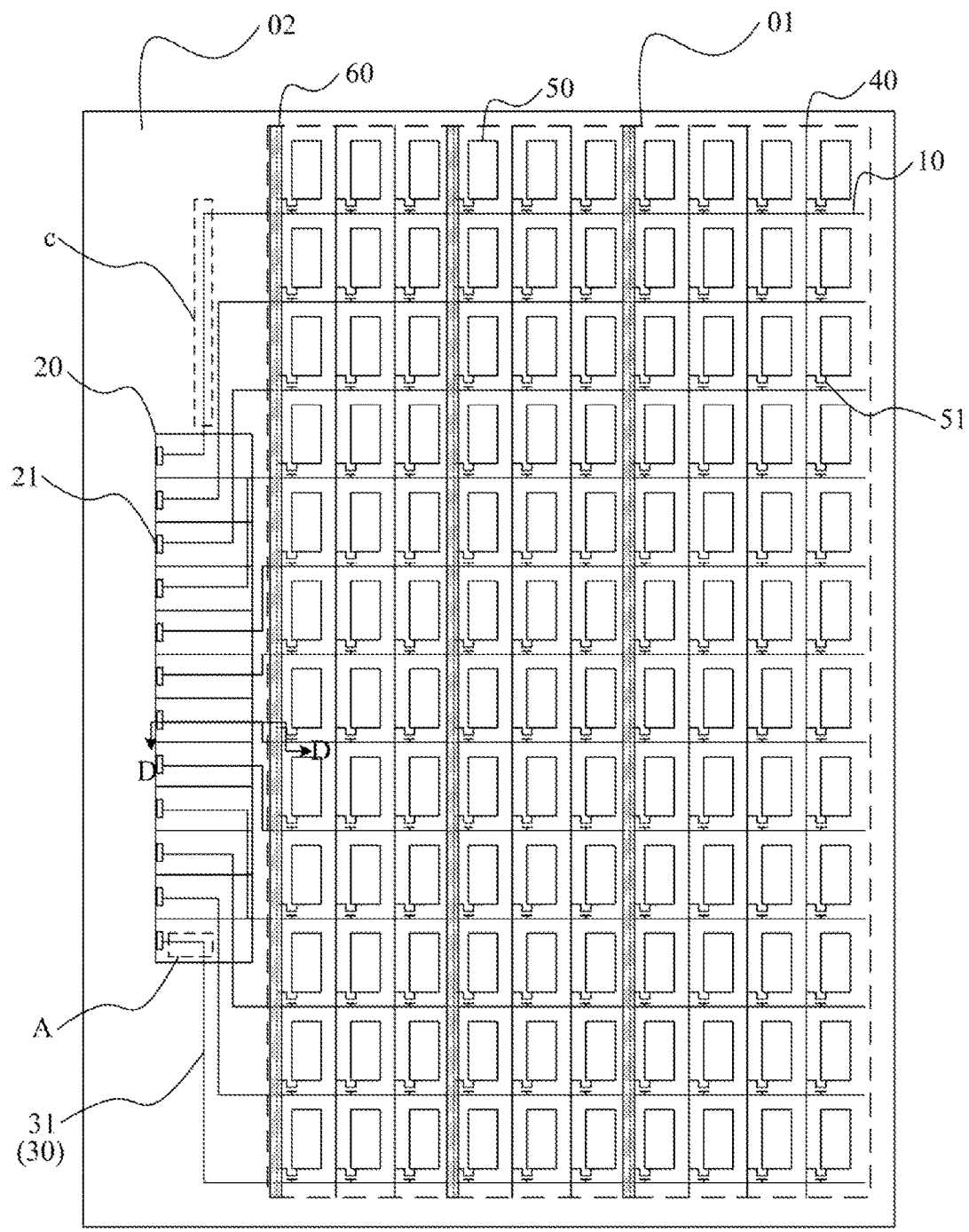
FIG. 3D illustrates a structural schematic diagram of another array substrate consistent with an embodiment of the present disclosure.

In one embodiment, as illustrated in FIG. 3D which schematically illustrates a structure of a still another array substrate consistent with an embodiment of the present disclosure, a signal output 21 electrically connected with a first gate fan-out line 31 may be located at an edge position of the gate driving circuit 20 farthest away from the display area 01, i.e., the distance between the signal output 21 and the edge of the gate driving circuit 20 farthest away from the display area 01 is 0.

In one embodiment, in the embodiment of the present disclosure, a signal output 21 electrically connected with a first gate fan-out line 31 is located at an edge position of the gate driving circuit 20 farthest away from the display area 01, so that the overlapping area A where the first gate fan-out line 31 and the gate driving circuit 20 overlap can be maximized to minimize space occupied by the first gate fan-out line 31 outside the gate driving circuit 20 and to shorten the distance between the gate driving circuit 20 and the display area 01 as much as possible, and thus the width of the non-display area 02 in the extension direction of the gate lines 10 is narrowed to reduce the width of the bezel of the display panel as much as possible.

In one embodiment, in the array substrate consistent with embodiments of the present disclosure, distance between the gate driving circuit 20 and the display area 01 is greater than or equal to 40 μm and is smaller than 100 μm.

In one embodiment, in the embodiment of the present disclosure, the distance between the gate driving circuit 20 and the display area 01 is set to be greater than or equal to 40 μm to ensure that signal interference does not occur among components (such as gate lines, data lines and transistors) in the gate driving circuit 20 and in the display area 01. Moreover, a width of gate fan-out lines area between the gate driving circuit 20 and the display area 01 in prior arts is 100 μm-200 μm, whereas the technical solution consistent with embodiments of the present disclosure can limit the distance between the gate driving circuit 20 and the display area 01 to be within 100 μm, i.e., be smaller than 100 μm, so that the width of the non-display area 01 in the extension direction of the gate lines 10 can be reduced to realize a narrow bezel while it is ensured that the components in the gate driving circuit 20 and in the display area 01 do not cause signal interference.

Figure 4A:
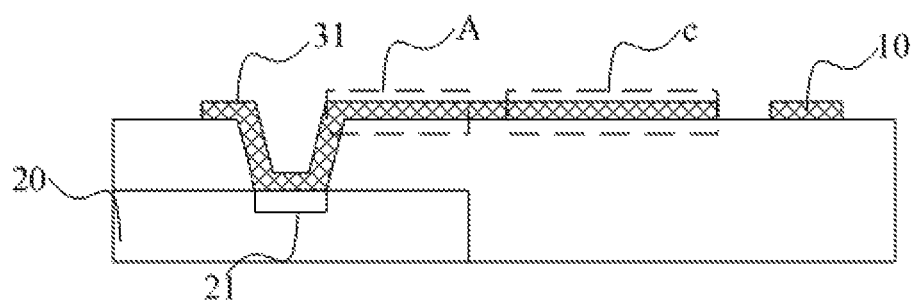
FIG. 4A illustrates a sectional schematic view of the array substrate illustrated by FIG. 3A in a B-B direction.

In one embodiment, as illustrated in FIG. 4A which illustrates a sectional schematic view of the array substrate illustrated by FIG. 3A in a direction of B-B, a portion of a first gate fan-out line 31 inside an overlapping area A can be arranged in a same layer as at least two gate lines 10.

In one embodiment, in order to ensure that the portion of the first gate fan-out line 31 inside the overlapping area A is arranged in a different layer from where the gate driving circuit 20 is arranged, in a situation where the gate driving circuit 20 and the gate lines 10 are arranged in different layers, the portion of the first gate fan-out line 31 inside the overlapping area A and the gate lines 10 may be arranged in the same layer. In the embodiment of the present disclosure, the portion of the first gate fan-out line 31 inside the overlapped portion A and the gate lines 10 are arranged in the same layer to form the portion of the first gate fan-out line 31 inside the overlapped portion A and the gate lines 10 through one patterning process, thereby the patterning process is simplified, the production cost is reduced and the production efficiency is improved.

Figure 4B:
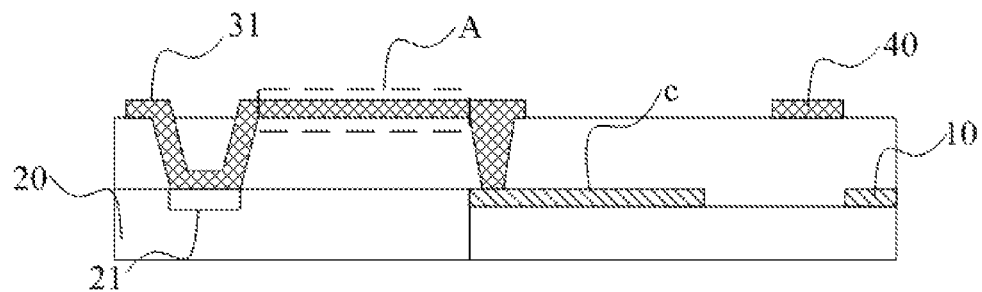
FIG. 4B illustrates a sectional schematic view of the array substrate illustrated by FIG. 3C in a C-C direction.

In one embodiment, as illustrated in FIG. 3C which illustrates a structural schematic diagram of an array substrate consistent with an embodiment of the present disclosure, the array substrate may further include at least two data lines 40 located in the display area 01. The data lines 40 extend along a first direction a and are arranged along a second direction b. The first direction a and the second direction b intersect. The gate lines 10 extend along the second direction and are arranged along the first direction. The gate lines 10 and the data lines 40 intersect to define at least two pixels 50. FIG. 3C exemplarily illustrates the structure by taking the first direction as a vertical direction and the second direction as a horizontal direction. And as illustrated in FIG. 4B which illustrates a sectional schematic view of the array substrate illustrated by FIG. 3C along a C-C direction, a portion of a first gate fan-out line 31 inside an overlapping area and at least two data lines 40 are arranged in a same layer.

In one embodiment, in order to ensure that the portion of the first gate fan-out line 31 inside the overlapping area A and the gate driving circuit 20 are arranged in different layers, in a situation that the gate driving circuit 20 and the data lines 40 are arranged in different layers, the portion of the first gate fan-out line 31 inside the overlapping area A and the data lines 40 may be arranged in the same layer. In the embodiment of the present disclosure, the portion of the first gate fan-out line 31 inside the overlapping area A and the data lines 40 are arranged in the same layer to form the portion of the first gate fan-out line 31 inside the overlapped portion A and the data lines 40 through one patterning process, thereby the patterning process is simplified, the production cost is reduced and the production efficiency is improved.

Figure 4C:
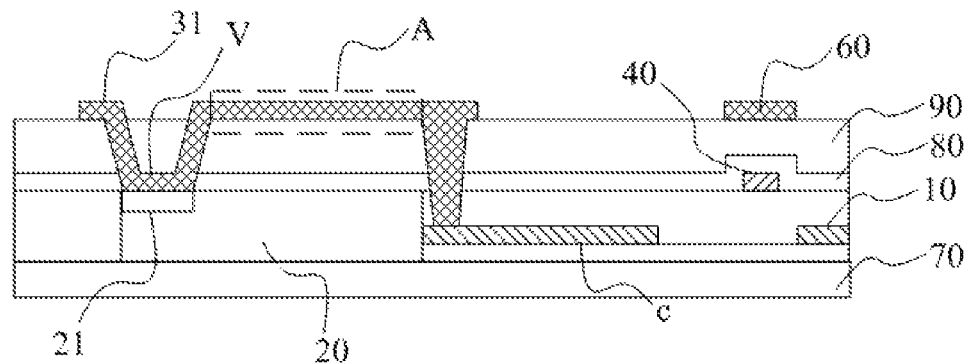
FIG. 4C illustrates a sectional schematic view of the array substrate illustrated by FIG. 3D in a D-D direction.

In one embodiment, as illustrated in FIG. 3D, which illustrates a structural schematic diagram of an array substrate consistent with an embodiment of the present disclosure, the array substrate may further include at least two touch signal lines 60 located in the display area 01. As illustrated in FIG. 4C, which illustrates a sectional schematic view of the array substrate illustrated by FIG. 3D in a D-D direction, a portion of a first gate fan-out line 31 inside an overlapping area A and at least two touch signal lines 60 are arranged in a same layer.

In one embodiment, in order to ensure that the portion of the first gate fan-out line 31 inside the overlapping area A and the gate driving circuit 20 are arranged in different layers, in a situation where the gate driving circuit 20 and the touch signal lines 60 are arranged in different layers, the portion of the first gate fan-out line 31 inside the overlapping area A and the touch signal lines 60 may be arranged in the same layer. In the embodiment of the present disclosure, the portion of the first gate fan-out line 31 inside the overlapping area A and the touch signal lines 60 are arranged in the same layer to form the portion of the first gate fan-out line 31 inside the overlapped portion A and the touch signal lines 60 through one patterning process, thereby the patterning process is simplified, the production cost is reduced and the production efficiency is improved.

In one embodiment, as illustrated in FIG. 4C, which illustrates the sectional schematic view of the array substrate illustrated by FIG. 3D in the D-D direction, the array substrate may further include an underlying substrate 70, a first inorganic insulated layer 80 and a first organic insulated layer 90. A first gate fan-out line 31 is located on one side of the gate driving circuit 20 farthest away from the underlying substrate 70. The first inorganic insulated layer 80 and the first organic insulated layer 90 are located between the first gate fan-out line 31 and the gate driving circuit 20, and the first organic insulated layer 90 is located on one side of the first inorganic insulated layer 80 farthest away from the underlying substrate 70. The first gate fan-out line 31 is electrically connected with the corresponding signal output 31 through a via hole V.

In one embodiment, in the embodiment of the present disclosure, the first inorganic insulated layer 80 and the first organic insulated layer 90 are provided between the first gate fan-out line 31 and the gate driving circuit 20, so a thick insulating medium could exist between the first gate fan-out line 31 and the gate driving circuit 20 to effectively reduce the parasitic capacitance between the first gate fan-out line 31 and the gate driving circuit 20 and to reduce mutual interference during signal transmission between the two.

In one embodiment, in the array substrate consistent with embodiments of the present disclosure, the array substrate includes at least two data lines 40 located in the display area 01. The data lines 40 extend along a first direction and are arranged along a second direction, and the first direction and the second direction intersect. The gate lines 10 extend along the second direction and are arranged along the first direction, and the gate lines 10 and the data lines 40 intersect to define at least two pixels 50. As illustrated in FIG. 4C, which illustrates the sectional schematic view of the array substrate illustrated by FIG. 3D in the D-D direction, the data lines 40 and the touch signal lines 60 may be arranged in different layers, and a touch signal line 60 and a data line 40 overlap in a direction perpendicular to a plane in which the array substrate is located.

In one embodiment, as illustrated in FIG. 4C, which illustrates a sectional schematic view of the array substrate illustrated by FIG. 3D in a D-D direction, said the touch signal lines 60 and the data lines 40 overlap may refer to that orthogonal projections of the touch signal lines 60 fully covers orthogonal projections of the data lines 40, or may also refer to that the orthogonal projections of the touch signal lines 60 and of the data lines 40 partially overlap, which is not limited herein. In the embodiment of the present disclosure, since the touch signal lines 60 and the data lines 40 overlap, an aperture ratio of the pixels 50 can be increased and a gap distance between two adjacent pixels 50 can be reduced to facilitate high-resolution display. Besides, when the data lines 40 and the touch signal lines 60 are arranged in different layers, the first organic insulated layer 80 and the first inorganic insulated layer 90 are also provided between the data lines 40 and the touch signal lines 60, so the parasitic capacitance between the data lines 40 and the touch signal lines 60 can be effectively reduced to reduce mutual interference during signal transmission between the two.

Figure 3E:
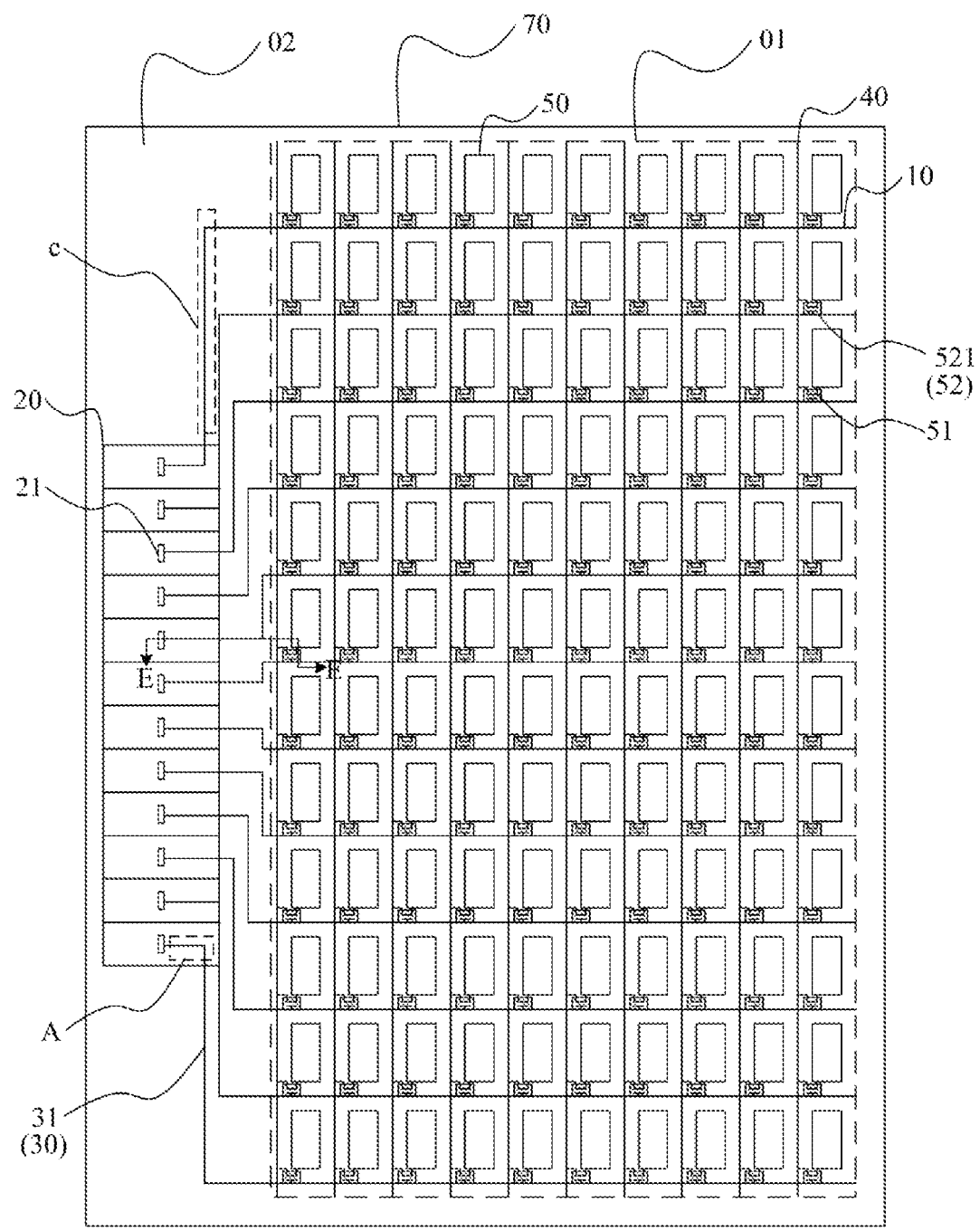
FIG. 3E illustrates a structural schematic diagram of another array substrate consistent with an embodiment of the present disclosure.
Figure 4D:
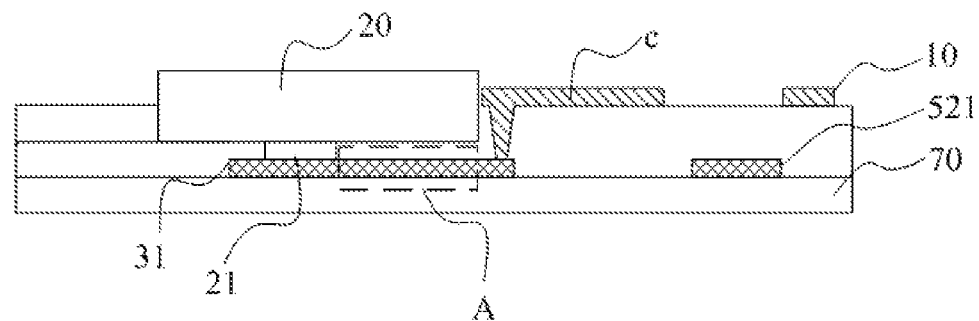
FIG. 4D illustrates a sectional schematic view of the array substrate illustrated by FIG. 3E in an E-E direction.

In one embodiment, as illustrated in FIG. 3E, which schematically illustrate a structure of still another array substrate consistent with an embodiment of the present disclosure, the array substrate further includes an underlying substrate 70 and at least two data lines 40. The data lines 40 extend along a first direction and are arranged along a second direction. The gate lines 10 extend along the second direction and are arranged along the first direction. The gate lines 10 and the data lines 40 intersect to define at least two pixels 50 and each of the pixels 50 includes at least one thin film transistor 51 and a light shielding metal layer 52. The light shielding metal layer 52 is located on one side of the at least one thin film transistor 51 closet to the underlying substrate 70. As illustrated by FIG. 4D, which is a schematic sectional view of the array substrate illustrated by FIG. 3E along an E-E direction, a portion of a first gate fan-out line 31 inside an overlapping area A is located in a light shielding metal layer 52. The light shielding metal layer 52 includes at least two light shielding metal blocks 521, and each light shielding metal block 521 is configured to cover a channel area of an active layer of a corresponding thin film transistor 51, so as to prevent light incident form one side of the underlying substrate 70 from irradiating the channel area to form photo-generated carriers and to influence an on/off state of the thin film transistor 51. Based on this, each light shielding metal block 521 should at least cover the channel area and is generally configured to cover the area of the active layer, which is not limited herein.

In one embodiment, in order to ensure that the portion of the first gate fan-out line 31 inside the overlapping area A and the gate driving circuit 20 are arranged in different layers, in a situation that the gate driving circuit 20 and the light shielding metal layer 52 are arranged in different layers, the portion of the first gate fan-out line 31 inside the overlapping area A may be arranged in the light shielding metal layer 52. In the embodiment of the present disclosure, the portion of the first gate fan-out line 31 inside the overlapping area A is arranged in the light shielding metal layer 52, so the portion of the first gate fan-out line 31 inside the overlapped portion A and the light shielding metal layer 52 may be formed through one patterning process to simplify the patterning process, to reduce the production cost and to improve the production efficiency. Besides, generally, the light shielding metal layer 52 is located in a bottom lowest film layer of the array substrate, i.e., the film layer closest to the underlying substrate 70, and then the gate driving circuit 20 actually is located on one side of the first gate fan-out line 31 farthest away from the underlying substrate 70.

In one embodiment, in the array substrate consistent with embodiments of the present disclosure, a portion c of the first gate fan-out line 31 outside the overlapping area A, and the portion inside the overlapping area A may be arranged in different layers.

In one embodiment, for example, as illustrated in FIG. 4B, which illustrates the sectional schematic view of the array substrate illustrated by FIG. 3C in the C-C direction, when the portion of the first gate fan-out line 31 inside the overlapping area A and the data lines 40 are arranged in the same layer, the portion c of the first gate fan-out line 31 outside the overlapping area A and the gate lines 10 may be arranged in the same layer. For another example, as illustrated in FIG. 4C, which illustrates the sectional schematic view of the array substrate illustrated in FIG. 3D in the D-D direction, when the portion of the first gate fan-out line 31 inside the overlapping area A and the touch signal lines 60 are arranged in the same layer, the portion c of the first gate fan-out line 31 outside the overlapping area A and the gate lines 10 may be arranged in the same layer. For another example, as illustrated in FIG. 4D, which illustrates a sectional schematic view of the array substrate illustrated in FIG. 3E in the E-E direction, when the portion of the first gate fan-out line 31 inside the overlapping area A is located in the light shielding metal layer 52, the portion c of the first gate fan-out line 31 outside the overlapping area A and the gate lines 10 may be arranged in the same layer. In the embodiment of the present disclosure, the portion c of the first gate fan-out line 31 outside the overlapping area A and the portion inside the overlapping area A are arranged in different layers, so as to facilitate the connection between the portion of the first gate fan-out line 31 outside the overlapping area A and the gate lines 10 and to simplify the complexity of wiring in the array substrate.

In one embodiment, in the array substrate consistent with embodiments of the present disclosure, the portion of the first gate fan-out line 31 outside the overlapping area A and the portion inside the overlapping area A may also be arranged in different layers. For example, as illustrated in FIG. 4A, which illustrates the sectional schematic view of the array substrate illustrated in FIG. 3A in a B-B direction, when the portion of the first gate fan-out line 31 inside the overlapping area A and the gate lines 10 are arranged in the same layer, the portion c of the first gate fan-out line 31 outside the overlapping area A and the gate lines 10 may also be arranged in the same layer, and thereby the complexity of wiring in the array substrate can be simplified.

In one embodiment, as illustrated in FIG. 3A to FIG. 3E, which illustrate structural schematic diagrams of the five types of array substrates consistent with embodiments of the present disclosure, all corners of an array substrate may be right angles. Or as illustrated in FIG. 5A to FIG. 5B, which illustrate structural schematic diagrams of another two types of array substrates consistent with embodiments of the present disclosure, an array substrate may include at least one non-right-angle corner, e.g., the non-right-angle corner is an arc.

In one embodiment, as illustrated in FIG. 3A to FIG. 3E, which illustrate structural schematic diagrams of the five types of array substrates consistent with embodiments of the present disclosure, when all the corners of an array substrate are right angles, the shape of the array substrate may be considered as regularly rectangular and the array substrate may be applicable to a common rectangular display panel. As illustrated in FIG. 5A to FIG. 5B, which illustrate structural schematic diagrams of the two types of array substrates consistent with embodiments of the present disclosure, when an array substrate at least includes one non-right-angle corner, the shape of the array substrate is considered as irregular and the array substrate is generally applicable to a special-shaped display panel, such as a mobile phone with circular arc corners. The display area of the special-shaped display panel may be regularly rectangular or may also have an irregular shape. For example, the display area of the special-shaped display panel may be consistent with an external profile of the special-shaped display panel, which is not limited herein. When the array substrate consistent with embodiments of the present disclosure is applicable to display panels having any shapes, the width of the non-display area 02 can be reduced to decrease the width of the bezel of the display panel.

Figure 5A:
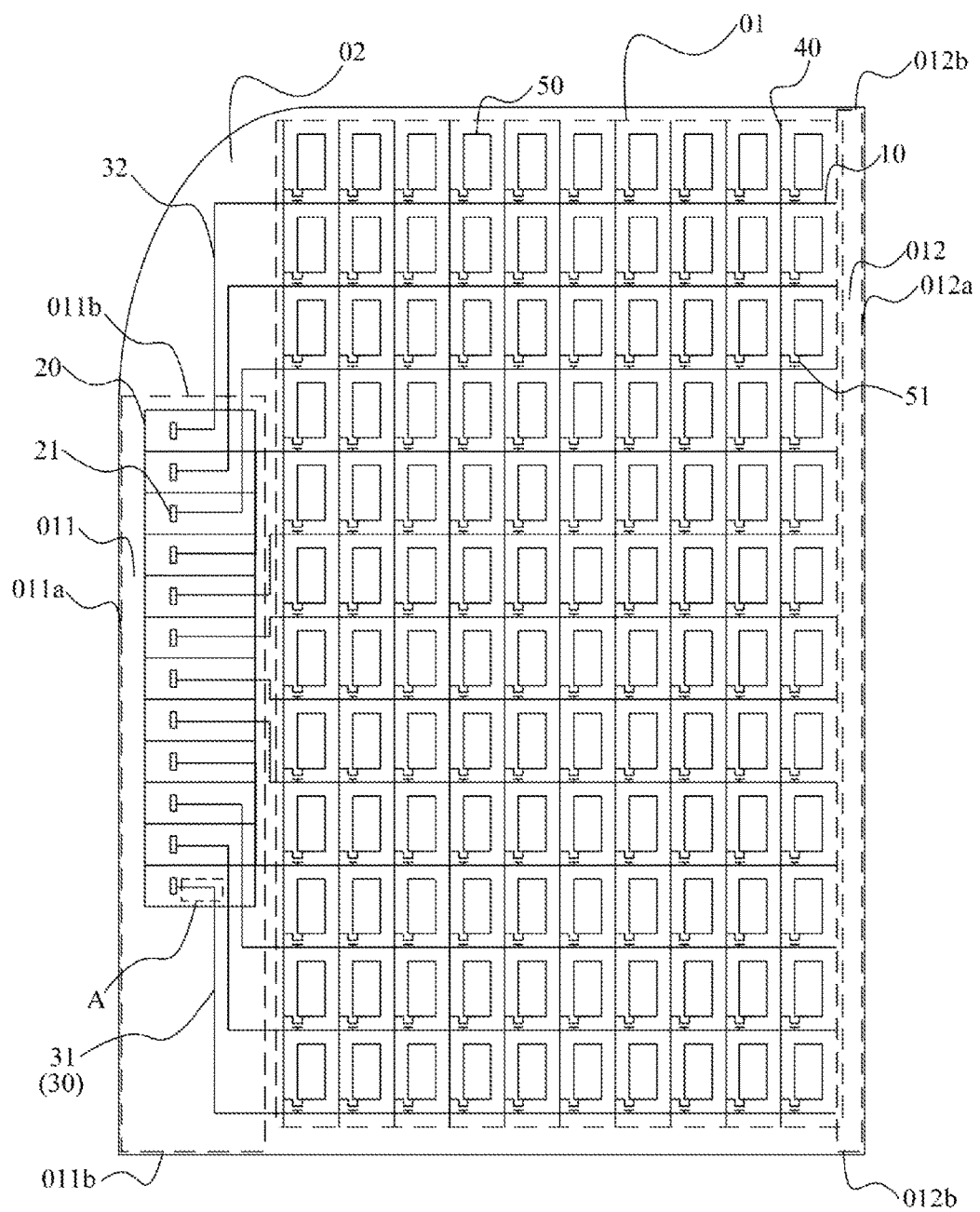
FIG. 5A illustrates a structural schematic diagram of another array substrate consistent with an embodiment of the present disclosure.
Figure 5B:
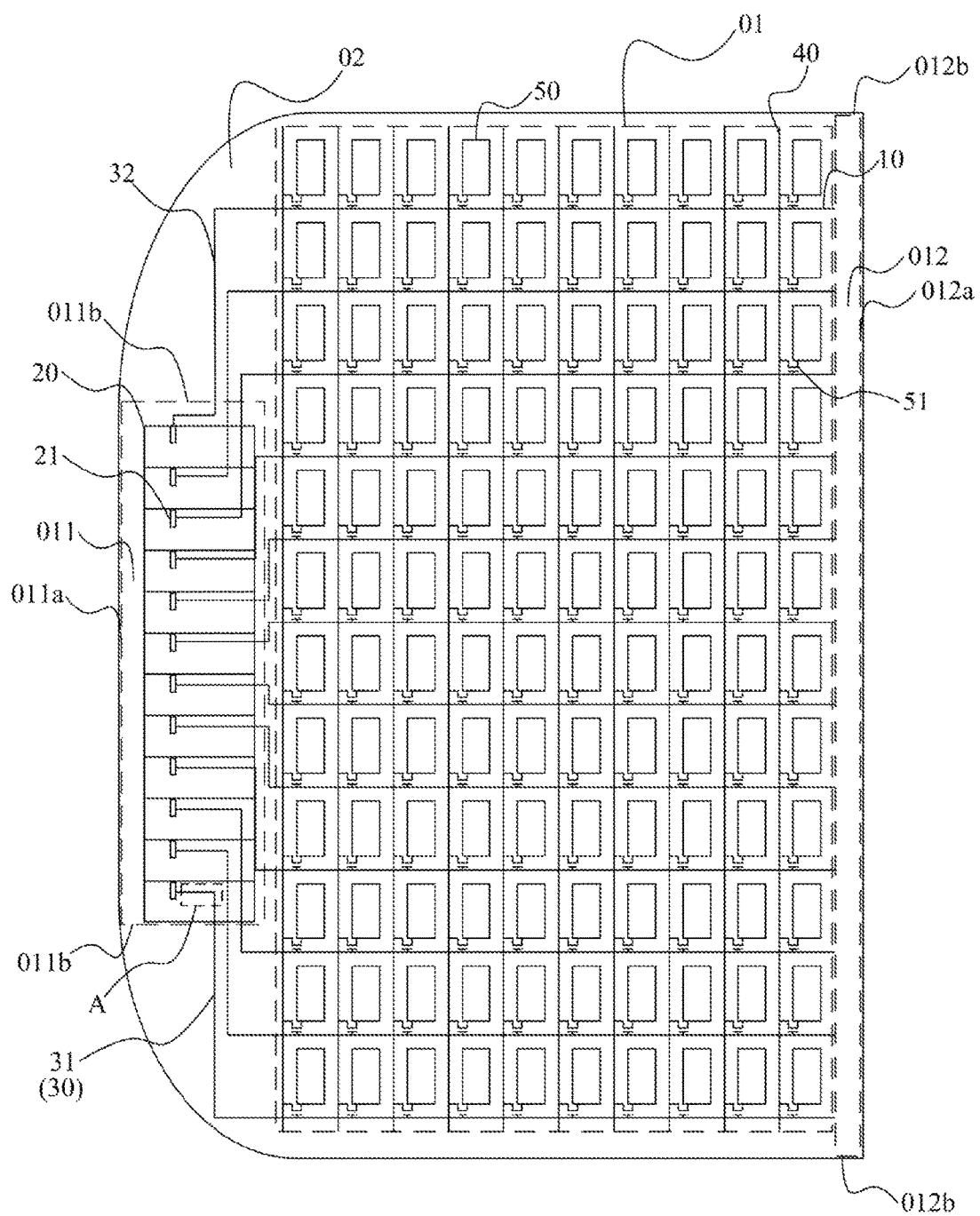
FIG. 5B illustrates a structural schematic diagram of another array substrate consistent with an embodiment of the present disclosure.

In one embodiment, as illustrated in FIG. 5A to FIG. 5B, which illustrate structural schematic diagrams of the other two types of array substrates consistent with embodiments of the present disclosure, when the array substrate includes at least one non-right-angle corner, in the extension direction of the gate lines 10 (generally horizontal), the non-display area 02 includes a first rectangular area 011 and a second rectangular area 012 located on two sides of the display area 01, respectively. The first rectangular area 011 includes a first straight line boundary 011a of the array substrate and the second rectangular area 012 includes a second straight line boundary 012a of the array substrate. The first straight line boundary 011a and the second straight line boundary 012a are respectively perpendicular to the extension direction of the gate lines 10 (generally the first straight line boundary 011a and the second straight line boundary 012a extend along the vertical direction), and the gate driving circuit is located in the first rectangular area and/or the second rectangular area.

In one embodiment, when the gate driving circuit is only located in the first rectangular area or the second rectangular area, the array substrate is unilaterally driven, which is generally applicable to an array substrate with a small size. When the gate driving circuit is simultaneously located in the first rectangular area and the second rectangular area, the array substrate is bilaterally driven, which is generally applicable to an array substrate with a large size. In addition, in the bilaterally driven array substrate, in order to facilitate wiring design, portions of the gate driving circuit respectively located in the first rectangular area and the second rectangular area are generally symmetrically designed, i.e., circuit layout of the two portions is generally consistent. However, when a corner on a same side as the first rectangular area 011 and a corner on a same side as the second rectangular area 012 are different (e.g., the corner on one side is a right angle and the corner on the other side is an arc), the portions of the gate driving circuit 20 respectively located in the first rectangular area 011 and the second rectangular area 012 are generally asymmetrically designed, and the circuit layout of the two portions is designed in combination with the shapes of the corners to optimize the use of the non-display area 02, and to facilitate a narrow-bezel design. FIG. 5A to FIG. 5B illustrate structural schematic diagrams of the other two types of array substrates consistent with embodiments of the present disclosure, by taking that the gate driving circuit 20 is only located in the first rectangular area 011 as an example, where FIG. 5A illustrates a situation of one non-right-angle corner, and FIG. 5B illustrates a situation of two non-right-angle corners.

In one embodiment, as illustrated in FIG. 5A to FIG. 5B, which illustrate structural schematic diagrams of the other two types of array substrates consistent with embodiments of the present disclosure, the gate fan-out lines 30 include at least one second gate fan-out line 32, and a gate fan-out line 32 is electrically connected with a portion of an gate line 10 extending out of the display area 01 in the non-display area 02 outside the first rectangular area 011 and the second rectangular area 012. The first rectangular area 011 further includes a first straight line side 011b and the second rectangular area 012 further includes a second straight line side 012b. The first straight line side 011b and the second straight line side 012b are respectively in parallel with the extension direction of the gate lines 10 (generally horizontal) and the at least one second gate fan-out line 032 passes the first straight line side 011b and/or the second straight line side 012b to be electrically connected with the signal output 21.

In one embodiment, since the second gate fan-out line 32 and the first gate fan-out line 31 are classified in different ways, where a gate fan-out line is classified as a second gate fan-out line 32 if the gate fan-out line passes the first (and/or the second) straight line side 001b (and/or 012b) to be electrically connected with a signal output 21, and a gate fan-out line is classified as a first gate fan-out line 31 if the gate fan-out line and the gate driving circuit 20 have an overlapping area A outside a mutual electrical connection area. Therefore, all the second gate fan-out lines 32 may be first gate fan-out lines 31. As illustrated in FIG. 5A, which illustrates a structural schematic diagram of another array substrate consistent with embodiments of the present disclosure, for example, when all signal outputs connected with the second gate fan-out lines 32 are not arranged on the first straight line side 011b (and/or the second straight line side 012b), each of the second gate fan-out lines 32 overlaps the gate driving circuit 20 in an overlapping area A outside a mutual electrical connection area. Then as illustrated in FIG. 5A, the signal outputs 21 of all shift registers in the gate driving circuit 20 may be arranged at a same position. Thereby, not only can the shift registers be consistent in wiring to simplify circuit layout, but also the width of the non-display area 02 can be reduced to decrease the width of the bezel of the display panel.

In one embodiment, at least one of the second gate fan-out lines 32 may also be a first gate fan-out line 31. As illustrated in FIG. 5B, which illustrates a structural schematic diagram of another array substrate consistent with embodiments of the present disclosure, for example, when a first signal output 21 connected with a second gate fan-out line 32 is arranged on the first straight line side 011b (and/or the second straight line side 012b) and other signal outputs are arranged at similar positions of other shift registers, each of the second gate fan-out lines 23 except the first second gate fan-out line 32 overlaps the gate driving circuit 20 in an overlapping area A outside a mutual electrical connection area. Then signal outputs 21 of all shift registers in the gate driving circuit 20 may also be arranged at a same position relative to each shift register. For example, as illustrated in FIG. 5B, the signal outputs 21 are all located on the topmost side of the shift registers. Thereby, not only can the shift registers be consistent in wiring to simplify circuit layout, but also the width of the non-display area 02 can be reduced to decrease the width of the bezel of the display panel. Embodiment of the present disclosure does not exclude a situation where a second gate fan-out line 32 is not a first gate fan-out line 31. For example, when the signal outputs connected with the second gate fan-out lines 32 are all arranged on the first straight line side 011b and/or the second straight line side 012b, all the second gate fan-out lines 32 are connected with the signal outputs 21 on the first straight line side 011b and/or on the second straight line side 012b. In the embodiment of the present disclosure, at least one second fan-out line 32 passes through the first straight line side 011b and/or the second straight line side 012b to be electrically connected with the signal output 21 to shorten the distance between the gate driving circuit 20 and the display area 01 as much as possible, and thus the width of the non-display area 02 is reduced to decrease the width of the bezel of the display panel.

In one embodiment, as illustrated in FIG. 3A to FIG. 3E, which illustrate structural schematic diagrams of the five types of array substrates consistent with embodiments of the present disclosure, when all the corners of the array substrate are right angles, the gate lines 10 are arranged in a first direction (generally vertical), and the length of the gate driving circuit 20 in the first direction is shorter than the length of the display area 01 in the first direction.

In one embodiment, in the embodiment of the present disclosure, when the length of the gate driving circuit 20 in the first direction is configured to be shorter than the length of the display area 01 in the first direction, therefore, by reducing the length of the gate driving circuit 20 in the first direction, a partial area of the non-display area 02 can be left in the first direction to arrange a circuit such as of electrostatic discharge, and thus the circuit layout of the non-display area 02 can be optimized and it may be beneficial for narrow-bezel design.

Figure 6:
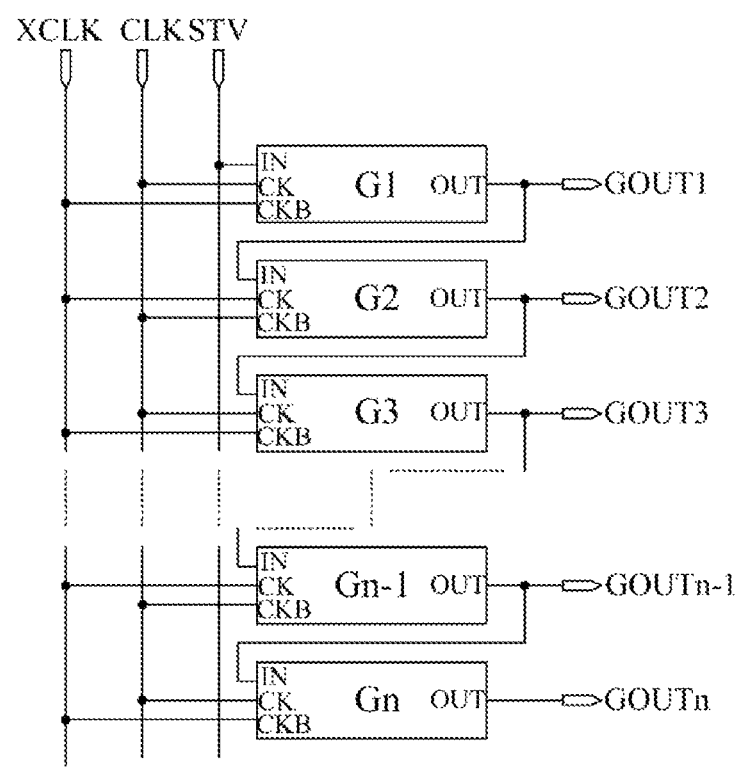
FIG. 6 illustrates a structural schematic diagram of a gate driving circuit.

In one embodiment, in the array substrate consistent with embodiments of the present disclosure, as illustrated in FIG. 6, which illustrates a structural schematic diagram of a gate driving circuit, and the gate driving circuit may include at least two cascaded shift registers G1, G2, G3 . . . Gn−1 and Gn (N shift registers in total, where 1≤n≤N). Except a shift register G1 at a first stage, a signal input IN of a shift register Gn at each stage is electrically connected with a signal output OUT of a shift register Gn−1 at a previous stage. The signal input IN of the shift register G1 at the first stage is electrically connected with a frame start signal end STV. A first clock signal end CK of a shift register at the (2k−1)th stage and a second clock signal end CKB of the shift register at the 2kth stage are both connected with a same clock end, i.e., the first clock end CLK. And a second clock signal end CKB of the shift register at the (2k−1)th stage and a first clock signal end CK of the shift register at the 2kth stage are both connected with a same clock end, i.e., the second clock end XCLK, where k is a positive integer.

Figure 7A:
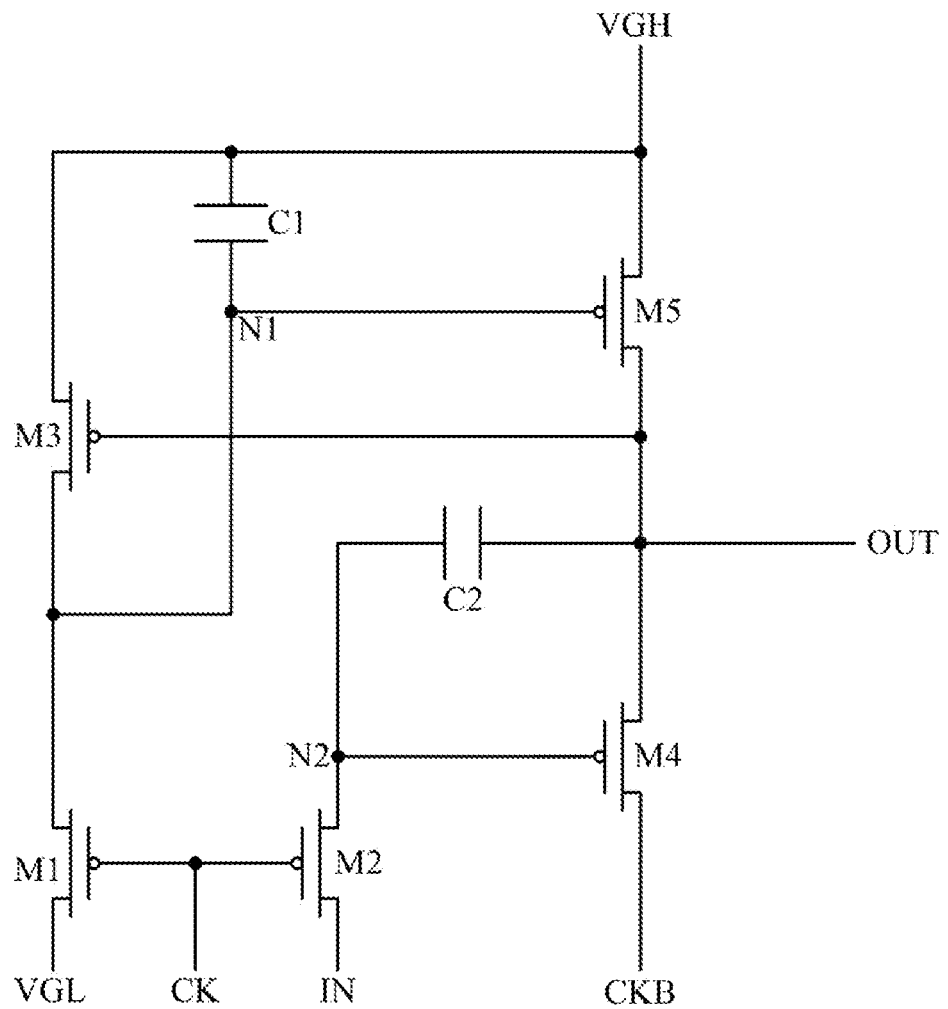
FIG. 7A illustrates a specific structural schematic diagram of a shift register.
Figure 7B:
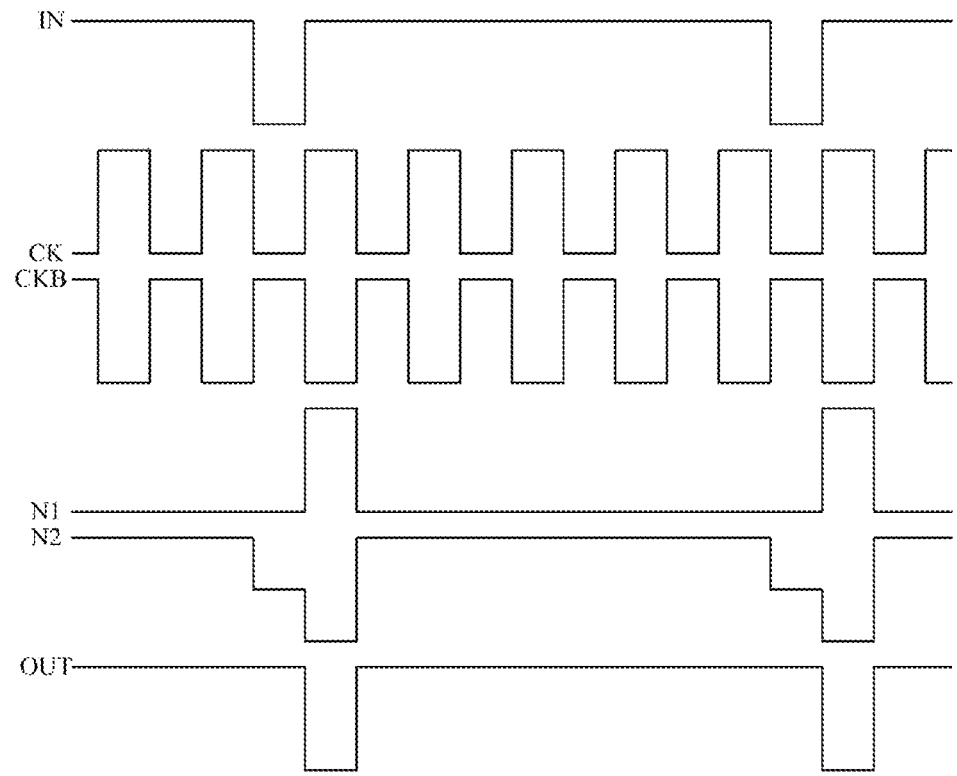
FIG. 7B illustrates an input/output timing diagram corresponding to the shift register illustrated by FIG. 7A.

In one embodiment, in the array substrate consistent with embodiments of the present disclosure, a specific structural diagram of a circuit of shift registers at each stage in the gate driving circuit 20 is illustrated by FIG. 7A, a corresponding signal timing diagram is illustrated by FIG. 7B, and the shift registers may include a first switching transistor M1 to a fifth switching transistor M5, which are all P-type thin film transistors.

In one embodiment, an operation principle of each shift register is: when a signal input IN and a first clock signal end CK are loaded with a low-level signal, a first switching transistor M1 and a second switching transistor M2 turn on, potentials at a first node N1 and at a second node N2 are low, a fifth switching transistor M5 and a fourth switching transistor M4 turn on, a third switching transistor M3 is cut off, a second clock signal end CKB is loaded with a high-level signal, and a signal output OUT outputs a high-level signal. When the signal input IN and the first clock signal end CK are loaded with a high-level signal, the first switching transistor M1 and the second switching transistor M2 are cut off, the potential at the second node N2 is pulled down further under the influence of the second capacitor C2, the fourth switching transistor M4 turns on, the second clock signal end CKB is loaded with a low-level signal, the signal output OUT outputs a low-level signal, the third switching transistor M3 turns on, the potential at the first node N1 is pulled up and the fifth switching transistor M5 is cut off. When the first clock signal end CK is loaded with a low-level signal, the first switching transistor M1 and the second switching transistor M2 turn on, the signal input IN is loaded with a high-level signal, the potential at the second node N2 is high, the fourth switching transistor M4 is cut off, the first node N1 is low-potential, the fifth switching transistor M5 turns on and the signal output OUT outputs a high-level signal.

Figure 8:
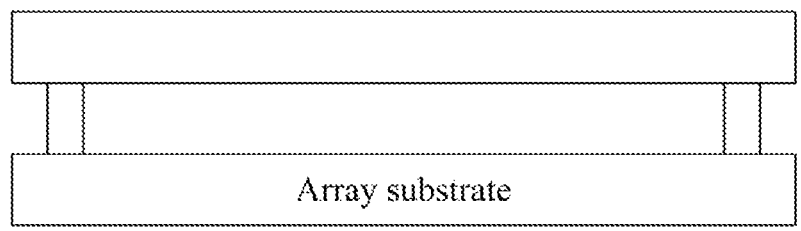
FIG. 8 illustrates a structural schematic diagram of a display panel consistent with an embodiment of the present disclosure.

Based on the same inventive concept, the embodiment of the present disclosure further provides a display panel. As illustrated in FIG. 8, the display panel includes the array substrate consistent with embodiments of the present disclosure. Since the principles adopted by the display panel for solving the problem are similar to that adopted by the above-mentioned array substrate, the display panel may be implemented with reference to the implementation of the above-mentioned array substrate, and details are not repeated herein.

In one embodiment, the display panel consistent with embodiments of the present disclosure may be any display panel including an array substrate, such as a liquid crystal display panel, an organic electroluminescent display panel or a plasma display panel. The display panel may be a rigid display panel or may also be a flexible display panel. FIG. 8 only illustrates a rigid display panel. However, the present application is not limited thereto.

Figure 9:
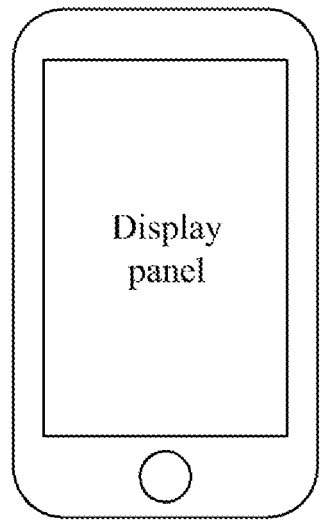
FIG. 9 illustrates a structural schematic diagram of a display device consistent with an embodiment of the present disclosure.

Based on the same inventive concept, the embodiment of the present disclosure further provides a display device. As illustrated in FIG. 9, the display device includes the display panel consistent with embodiments of the present disclosure. The display device may be any product or component having a display function such as a mobile phone, a tablet computer, a television, a display, a notebook computer, a digital photo frame or a navigator. The display device may be implemented with reference to the implementation of the above-mentioned display panel, and details are not repeated herein.

The embodiment of the present disclosure provides an array substrate, a display panel and a display device. The array substrate includes at least two gate lines located in a display area, a gate driving circuit and at least two gate fan-out lines located in a non-display area, respectively. One end of each of the gate fan-out lines are electrically connected with at least two signal outputs of the gate driving circuit and the other end of each of the gate fan-out lines are electrically connected with the gate lines. By configuring a first gate fan-out line of the gate fan-out lines and the gate driving circuit to have an overlapping area outside a mutual electrical connection area, and by arranging a portion of the first gate fan-out line in the overlapping area and the gate driving circuit in different layers, the first gate fan-out line could overlap the gate driving circuit, so an area where the gate fan-out lines are located overlaps the gate driving circuit, space occupied by the first gate fan-out line in an area outside the gate driving circuit is decreased to shorten a distance between the gate driving circuit and the display area as much as possible, and thus a width of the non-display area in an extension direction of the gate lines is reduced to decrease a width of a bezel of the display panel.

The invention claimed is:
1. An array substrate, comprising:
a display area, a non-display area surrounding the display area, at least two gate lines in the display area, a gate driving circuit and at least two gate fan-out lines in the non-display area, respectively, wherein:
one end of each of the gate fan-out lines is electrically connected with one of at least two signal outputs of the gate driving circuit and the other end of each of the gate fan-out lines is electrically connected with one of the gate lines; and
a first gate fan-out line of the gate fan-out lines overlaps the gate driving circuit in an overlapping area outside a mutual electrical connection area, and a portion of the first gate fan-out line in the overlapping area and the gate driving circuit are arranged in different layers;
in an extension direction of the gate lines, a distance between the signal output electrically connected with the first gate fan-out line and an edge of the gate driving circuit closest to the display area is a first distance, a distance between the signal output electrically connected with the first gate fan-out line and an edge of the gate driving circuit farthest away from the display area is a second distance, and the first distance is greater than or equal to the second distance.

2. The array substrate according to claim 1, wherein:
the gate fan-out lines are first gate fan-out lines.

3. The array substrate according to claim 1, wherein:
the signal output electrically connected with the first gate fan-out line is at an edge of the gate driving circuit position farthest away from the display area.

4. The array substrate according to claim 1, wherein:
a distance between the gate driving circuit and the display area is greater than or equal to 40 μm and is smaller than 100 μm.

5. The array substrate according to claim 1, wherein:
the array substrate further comprises at least two touch signal lines in the display area; and
the portion of the first gate fan-out line inside the overlapping area and the touch signal lines are arranged in the same layer.

6. The array substrate according to claim 5, wherein:
the array substrate further comprises an underlying substrate, a first organic insulated layer and a first inorganic insulated layer;
the first gate fan-out line is located on one side of the gate driving circuit farthest away from the underlying substrate, the first organic insulated layer and the first inorganic insulated layer are located between the first gate fan-out line and the gate driving circuit, and the first organic insulated layer is located on one side of the first inorganic insulated layer farthest away from the underlying substrate; and
the first gate fan-out line is electrically connected with the corresponding signal output through a via hole.

7. The array substrate according to claim 5, wherein:
the array substrate further comprises at least two data lines in the display area, the data lines extend along a first direction and are arranged along a second direction, and the first direction and the second direction intersect;
the gate lines extend along the second direction and are arranged along the first direction, and the gate lines and the data lines intersect to define at least two pixels; and
the data lines and the touch signal lines are arranged in different layers, and a touch signal line and a data line overlap in a direction perpendicular to a plane where the array substrate is located.

8. The array substrate according to claim 1, wherein:
the portion of the first gate fan-out line outside the overlapping area and a portion of the first gate fan-out line inside the overlapping area are arranged in different layers.

9. The array substrate according claims 1, wherein:
all corners of the array substrates are right angles; or
the array substrate at least comprises one non-right-angle corner.

10. The array substrate according to claim 9, wherein:
all the corners of the array substrate are right angles; and
the gate lines are arranged in a first direction, and the length of the gate driving circuit in the first direction is shorter than the length of the display area in the first direction.

11. An array substrate, comprising:
a display area, a non-display area surrounding the display area, at least two gate lines in the display area, a gate driving circuit and at least two gate fan-out lines in the non-display area, respectively, wherein:
one end of each of the gate fan-out lines is electrically connected with one of at least two signal outputs of the gate driving circuit and the other end of each of the gate fan-out lines is electrically connected with one of the gate lines; and
a first gate fan-out line of the gate fan-out lines overlaps the gate driving circuit in an overlapping area outside a mutual electrical connection area, and a portion of the first gate fan-out line in the overlapping area and the gate driving circuit are arranged in different layers;
wherein the array substrate further comprises at least two touch signal lines in the display area; and
the portion of the first gate fan-out line inside the overlapping area and the touch signal lines are arranged in the same layer;
wherein the array substrate further comprises an underlying substrate, a first organic insulated layer and a first inorganic insulated layer;
the first gate fan-out line is located on one side of the gate driving circuit farthest away from the underlying substrate, the first organic insulated layer and the first inorganic insulated layer are located between the first gate fan-out line and the gate driving circuit, and the first organic insulated layer is located on one side of the first inorganic insulated layer farthest away from the underlying substrate; and
the first gate fan-out line is electrically connected with the corresponding signal output through a via hole.

12. The array substrate according to claim 11, wherein:
the gate fan-out lines are first gate fan-out lines.

13. The array substrate according to claim 11, wherein:
a distance between the gate driving circuit and the display area is greater than or equal to 40 μm and is smaller than 100 μm.

14. The array substrate according to claim 11, wherein:
the array substrate further comprises at least two data lines in the display area, the data lines extend along a first direction and are arranged along a second direction, and the first direction and the second direction intersect;
the gate lines extend along the second direction and are arranged along the first direction, and the gate lines and the data lines intersect to define at least two pixels; and
the data lines and the touch signal lines are arranged in different layers, and a touch signal line and a data line overlap in a direction perpendicular to a plane where the array substrate is located.

15. The array substrate according to claim 11, wherein:
the portion of the first gate fan-out line outside the overlapping area and a portion of the first gate fan-out line inside the overlapping area are arranged in different layers.

16. An array substrate, comprising:
a display area, a non-display area surrounding the display area, at least two gate lines in the display area, a gate driving circuit and at least two gate fan-out lines in the non-display area, respectively, wherein:
one end of each of the gate fan-out lines is electrically connected with one of at least two signal outputs of the gate driving circuit and the other end of each of the gate fan-out lines is electrically connected with one of the gate lines; and
a first gate fan-out line of the gate fan-out lines overlaps the gate driving circuit in an overlapping area outside a mutual electrical connection area, and a portion of the first gate fan-out line in the overlapping area and the gate driving circuit are arranged in different layers;

wherein:
the portion of the first gate fan-out line outside the overlapping area and a portion of the first gate fan-out line inside the overlapping area are arranged in different layers.

17. The array substrate according to claim 16, wherein:
the gate fan-out lines are first gate fan-out lines.

18. The array substrate according to claim 16, wherein:
a distance between the gate driving circuit and the display area is greater than or equal to 40 μm and is smaller than 100 μm.

19. The array substrate according to claim 16, wherein:
the array substrate further comprises at least two touch signal lines in the display area; and
the portion of the first gate fan-out line inside the overlapping area and the touch signal lines are arranged in the same layer.

20. The array substrate according to claim 19, wherein:
the array substrate further comprises at least two data lines in the display area, the data lines extend along a first direction and are arranged along a second direction, and the first direction and the second direction intersect;
the gate lines extend along the second direction and are arranged along the first direction, and the gate lines and the data lines intersect to define at least two pixels; and
the data lines and the touch signal lines are arranged in different layers, and a touch signal line and a data line overlap in a direction perpendicular to a plane where the array substrate is located.

* * * * *